United States Patent
Boecking et al.

(10) Patent No.: US 7,271,526 B2
(45) Date of Patent: Sep. 18, 2007

(54) PIEZOELECTRIC ACTUATOR

(75) Inventors: Friedrich Boecking, Stuttgart (DE); Ulrich Schoor, Stuttgart (DE); Bertram Sugg, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 124 days.

(21) Appl. No.: 10/539,041

(22) PCT Filed: Oct. 10, 2003

(86) PCT No.: PCT/DE03/03366

§ 371 (c)(1),
(2), (4) Date: Jun. 15, 2005

(87) PCT Pub. No.: WO2004/061987

PCT Pub. Date: Jul. 22, 2004

(65) Prior Publication Data

US 2006/0125354 A1    Jun. 15, 2006

(30) Foreign Application Priority Data

Dec. 23, 2002 (DE) ................................ 102 60 854

(51) Int. Cl.
*H01L 41/083* (2006.01)
*H01L 41/047* (2006.01)
(52) U.S. Cl. ...................................... 310/366; 310/367
(58) Field of Classification Search ................ 310/328, 310/366–368
See application file for complete search history.

(56) References Cited

U.S. PATENT DOCUMENTS

| | | | |
|---|---|---|---|
| 5,252,883 A | 10/1993 | Kondo | |
| 6,054,793 A * | 4/2000 | Kawai et al. | 310/312 |
| 6,462,464 B2 * | 10/2002 | Mitarai et al. | 310/366 |
| 6,930,435 B2 * | 8/2005 | Boecking | 310/317 |
| 2002/0152857 A1 | 10/2002 | Sato et al. | |
| 2002/0153431 A1 | 10/2002 | Sato et al. | |
| 2002/0185935 A1 * | 12/2002 | Yamamoto et al. | 310/328 |
| 2005/0046310 A1 * | 3/2005 | Kobayashi et al. | 310/328 |
| 2006/0113871 A1 * | 6/2006 | Schoor | 310/328 |

FOREIGN PATENT DOCUMENTS

WO    WO 03/010835 A2    2/2003

\* cited by examiner

*Primary Examiner*—Thomas M. Dougherty
(74) *Attorney, Agent, or Firm*—Ronald E. Greigg

(57) ABSTRACT

A piezoelectric actuator for actuating a mechanical component, having a multilayered structure of piezoelectric layers with inner electrodes disposed between them and contacting outer electrodes on alternating sides and the piezoelectric actuator has chamfered corners or edges. In the region of the corners or edges, on the sides of the piezoelectric actuator on which the inner electrodes with alternating polarities are routed to the respective outer electrodes, the inner electrodes have a contour that makes it possible to achieve a lower field intensity between the inner electrodes of alternating polarities in the structure of piezoelectric layers. This is achieved by virtue of the fact that on the side that does not contact the outer electrodes, the edge has an obtuse angle ($\alpha$) or is rounded.

6 Claims, 2 Drawing Sheets

PIEZOELECTRIC ACTUATOR

CROSS-REFERENCE TO RELATED APPLICATIONS

This application is a 35 USC 371 application of PCT/DE 03/03366 filed on Oct. 10, 2003.

BACKGROUND OF THE INVENTION

1. Field of the Invention

The invention relates to a piezoelectric actuator, for example for actuating a mechanical component such as a valve or the like.

2. Description of the Prior Art

It is generally known that the so-called piezoelectric effect can be used to produce a piezoelectric element partly comprised of ceramic material with a suitable crystalline structure. When an external electrical voltage is applied, a mechanical reaction of the piezoelectric element occurs, which produces a pressure or tension in a direction that can be predetermined as a function of the crystalline structure and the regions to which the electrical voltage is applied. Such piezoelectric actuators are particularly suitable for use in rapid and precise switching procedures, for example in various injector-equipped gasoline or diesel injection systems for internal combustion engines.

These piezoelectric actuators can be structured in a number of layers, in the form of so-called multilayered piezoelectric actuators in which the layers are respectively interleaved with the electrodes that are used to apply the electrical voltage. To that end, piezoelectric sheets with printed electrode surfaces serving as inner electrodes are stacked in alternation. In this design, a sheet has its connection only on a connection side and on its opposite side, must have an edge without an inner electrode and this edge must be provided with an insulating space. The two sides are then connected on the outside by means of outer electrodes. The piezoelectric actuator is thus produced in a known way with a number of plates, much like a capacitor.

These known multilayered piezoelectric actuators predominantly have rectangular inner electrodes with corners that are usually sharply chamfered on opposite sides, on which the connecting potentials are routed to the surface. In this case, the two inner electrode potentials can then be disposed next to each other on the surface, with a ceramic layer between them. These piezoelectric actuators, however, are operated with field intensities that require an insulation of the open leakage paths in the ceramic between the potentials. Suitable lacquers or insulating materials with favorable adhesion and favorable breakdown and insulation characteristics can, for example, be applied in the usual way, by spraying or immersion.

The above-described piezoelectric actuators with inner electrodes routed outward on alternating sides often tend to fail in regions in which the inner electrodes have relatively sharp angles. Since as a rule, the edges on the piezoelectric actuator have to be broken at the mechanically soft piezoelectric ceramic, this yields the above-described corners that are chamfered at an angle of 45°. If inner electrodes protrude outward at these points, then an increased danger of short-circuiting is present there for the reasons mentioned above. Since the electrical field intensity is in inverse quadratic proportion to the curvature radius of the equipotential surface, extremely high field intensities are generated there, which then cause the piezoelectric actuators to fail in this region due to short-circuiting.

It should also be noted that due to physical effects, an insufficient insulation thickness is built up at the sharp edges, i.e. due to a retraction of the insulation lacquer possibly applied. As a result, at the points in which the most insulation is in fact required by the increased field intensity due to the corner effect, the least insulation thickness is actually produced. It would be possible to apply a relatively large amount of lacquer in order to obtain a greater insulation lacquer thickness at the edges, but this can lead to lacquer fractures in the areas in which the lacquer is excessively thick.

DE 199 28 191 A1 has disclosed a multilayered piezoelectric actuator in which the piezoelectric layer that does not have an inner electrode to be contacted is recessed toward the inside in a predetermined region.

SUMMARY AND ADVANTAGES OF THE INVENTION

The piezoelectric actuator described at the beginning, which can be used, for example, to actuate a mechanical component, is comprised of a multilayered structure of piezoelectric layers with inner electrodes disposed between them. According to the invention, in the region of the corners or edges, on the sides of the piezoelectric actuator—which is chamfered here—where the inner electrodes are routed with alternating polarity to the respective outer electrodes, the inner electrodes have a contour that makes it possible to achieve a lower field intensity between the inner electrodes of opposite polarities in the structure of piezoelectric layers.

According to a first advantageous embodiment form, the chamfers at the corners of the piezoelectric actuator are embodied so that the edge on the side that is not contacted by the outer electrodes has an obtuse angle. Providing an obtuse or wide angle on the side of the edge segment at which the reciprocal electrodes extend outward makes it possible to easily avoid field peaks in the piezoelectric actuator in regions of inner electrodes that protrude outward beyond the piezoelectric layers, but on opposite sides. This drastically reduces the risk of a short circuit and consequently increases the reliability of the piezoelectric actuators.

The obtuse angle can be produced on the one hand by the electrode surface being adapted to the outer contour of the piezoelectric actuator. This occurs through the shaping in the so-called "green state" of the piezoelectric actuator before the sintering or through a hard machining after the sintering. Another possibility is to produce an obtuse angle already as part of the printed image in the production of the inner electrode.

According to a second advantageous embodiment, the chamfers at the corners of the piezoelectric actuator are embodied so that the edge is rounded, at least on the side that is not contacted by the outer electrode. In this case, it is also advantageously possible for the chamfers at the corners of the piezoelectric actuator to be embodied so that the entire corner of the piezoelectric actuator and correspondingly, the contour of the respectively non-contacted inner electrode to be rounded. On the other hand, it is also possible for the chamfers at the corners of the piezoelectric actuator to be simply embodied so that the entire corner of the piezoelectric actuator is simply beveled and the contour of the respectively non-contacted inner electrode is rounded.

It is also advantageous, according to one modification of the invention if, on the side that the inner electrode of the respective other polarity is contacted, the contour of the respectively non-contacted inner electrode is embodied so that it is recessed by a preset amount from the outer contour of the piezoelectric actuator. The contour of the respectively non-contacted inner electrode in this case can be recessed to correspond to the outer contour of the piezoelectric actuator.

In particular this embodiment can easily assure that sufficient insulation material remains between the non-contacted inner electrode and the surface of the piezoelectric actuator and consequently between the two electrode potentials. The powerful field intensities do not cause premature breakthrough damage; the additional covering and insulating ceramic layer here serves as a replacement for a possibly insufficient thickness of lacquer layers on the surface.

According to the invention, damage and slight abrasion tracks at the edges no longer inevitably lead to arc-overs and the lacquer thickness on the surface can be reduced on the whole and therefore no longer risks fracturing and more easily follows along with expansions of the actuator, without fracturing over time. In addition, the lacquer adheres altogether better in the corners and edges embodied according to the invention than it does at relatively sharp edges.

BRIEF DESCRIPTION OF THE DRAWINGS

Exemplary embodiments of the piezoelectric actuator according to are described more fully herein below, in conjunction with the drawings, in which.

DESCRIPTION OF THE PREFERRED EMBODIMENTS

Figure 1:
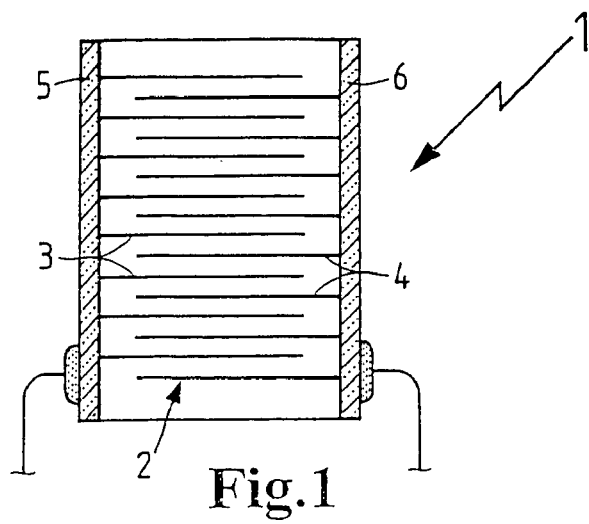
FIG. 1 shows a cross section through a piezoelectric actuator with a multilayered structure of layers of piezoelectric ceramic and electrodes according to the prior art.

FIG. 1 shows a piezoelectric actuator 1 essentially according to the prior art, which is comprised in an intrinsically known way of piezoelectric layers or piezoelectric sheets 2 of a quartz material with a suitable crystalline structure so that due to the so-called piezoelectric effect, when an external voltage is applied to inner electrodes 3 and 4 via contact surfaces and/or outer electrodes 5 and 6, a mechanical reaction of the piezoelectric actuator 1 occurs.

Figure 2:
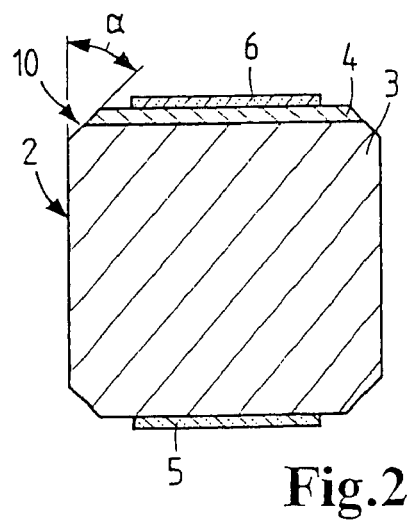
FIGS. 2 and 3 show piezoelectric layers with inner electrodes of alternating polarities with chamfered corners.

FIG. 2 shows a chamfered piezoelectric layer 2, with an inner electrode 3 that is contacted by the outer electrode 5. In the region of the contact of the other inner electrode 4 that can be seen in FIG. 3, on the left side of the piezoelectric actuator 1 according to FIG. 2, an angle a of the chamfered corner with the edge 10 is shown. Since as mentioned above, the edges on the piezoelectric actuator 1 are usually chamfered at an angle $\alpha$ of 45°, there is therefore an increased danger of short-circuiting at the corner 10.

Figure 3:
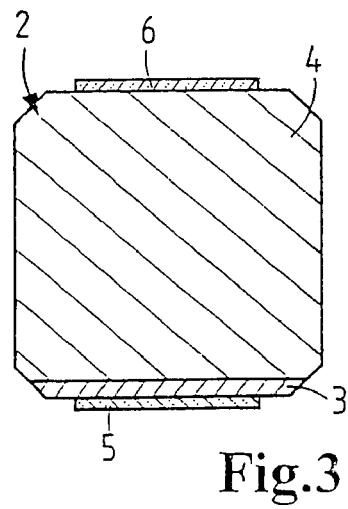
Figure 4:
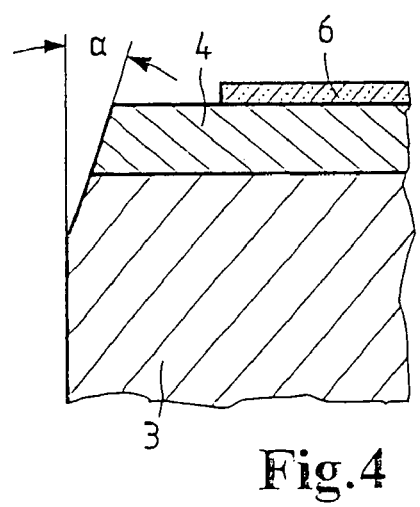
FIG. 4 shows an exemplary embodiment according to the invention of an electrode design with an obtuse angle in the region of overlapping inner electrodes.

By contrast with the depiction in FIG. 3, the exemplary embodiment according to the invention in FIG. 4 encloses an obtuse angle with the complementary angle of $\alpha < 45°$ so that in this case, field peaks in the piezoelectric actuator 1 are prevented in the regions of inner electrodes 3 and 4 that protrude beyond the piezoelectric layers 2, but on opposite sides.

Figure 5:
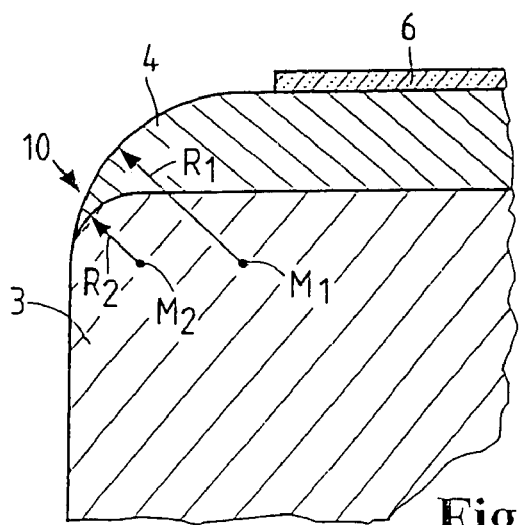
FIGS. 5 and 5a show a second exemplary embodiment according to the invention of an electrode design with rounded edges.
Figure 5A:
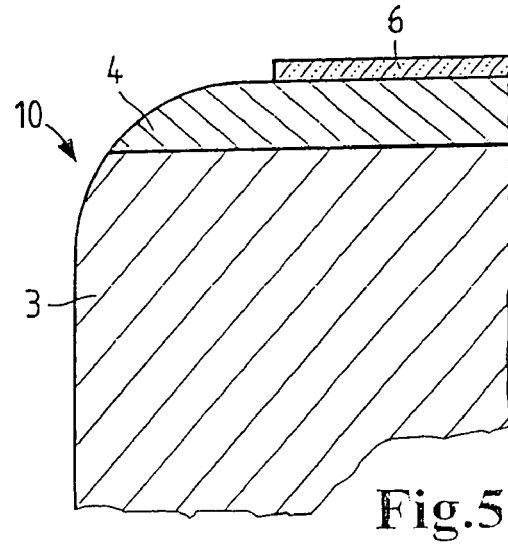

The electrode design of the exemplary embodiment in FIGS. 5 and 5a is comprised in that the inner electrode 3 is embodied so that it extends tangential to the outer surface of the piezoelectric actuator 1. The inner electrode 3 here is curved around a center point M2 with the radius R2. The outer contour of the piezoelectric actuator 1 can also be curved and, according to FIG. 5a, the inner electrode 3 can also be curved along with the outer contour. For example, this is represented in FIG. 5 by a curvature with a center point M1 and the radius R1.

Figure 6:
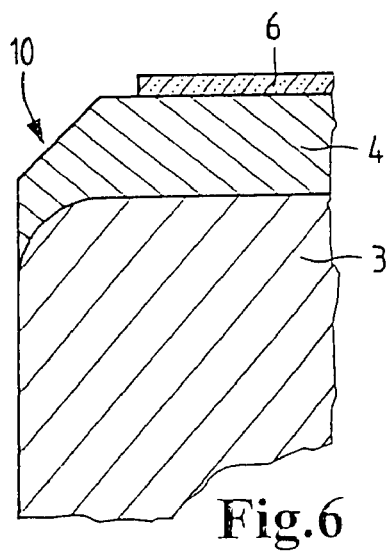
FIGS. 6 and 6a show another exemplary embodiment according to the invention of an electrode design with inwardly recessed rounded edges.
Figure 6A:
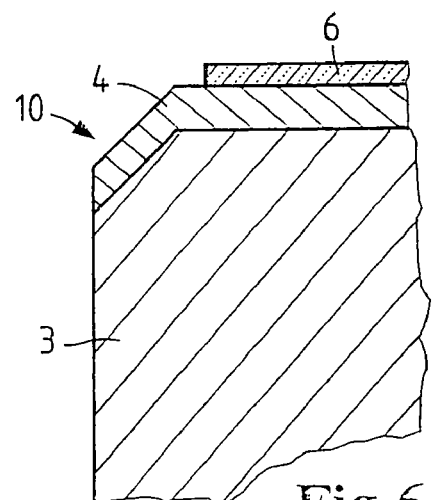

In an alternative embodiment according to FIG. 6, the outer contour of the inner electrodes 3 and 4 can also be embodied as straight-edged and the inner electrode 3 according to FIG. 6 that is not contacted here can, according to FIG. 6a, also be recessed inward in a corresponding fashion.

The foregoing relates to a preferred exemplary embodiments of the invention, it being understood that other variants and embodiments thereof are possible within the spirit and scope of the invention, the latter being defined by the appended claims.

The invention claimed is:

1. A piezoelectric actuator, comprising
   a multilayered structure of piezoelectric layers (2) with inner electrodes (3, 4) disposed between them,
   a contacting of the inner electrodes (3, 4) on alternating sides with outer electrodes (5, 6), and
   chamfered corners or edges (10) on the piezoelectric actuator (1), wherein
   the inner electrodes (3) having a contour in the region of the corners or edges (10), on the sides of the piezoelectric actuator (1) on which the inner electrodes (3, 4) with alternating polarities are routed to the respective outer electrodes (5, 6), that makes it possible to achieve a lower field intensity between the inner electrodes (3, 4) of alternating polarities in the structure of piezoelectric layers (2), wherein
   the chamfers at the corners of the piezoelectric actuator (1) are embodied so that the entire corner of the piezoelectric actuator (1) is beveled and the contour of the respectively non-contacted inner electrode (3), is rounded.

2. The piezoelectric actuator according to claim 1, wherein the chamfers at the corners of the piezoelectric actuator (1) are embodied so that the edge (10) on the side that is not contacted by the outer electrodes (5, 6) has an acute angle ($\alpha$) less than 45°.

3. The piezoelectric actuator according to claim 2, wherein
   on the side of that the inner electrode (4) of the respective opposite polarity is contacted, the contour of the respectively non-contacted inner electrode (3) is embodied so that it is recessed a preset amount from the outer contour of the piezoelectric actuator (1).

4. The piezoelectric actuator according to claim 3, wherein
   the contour of the respectively non-contacted inner electrode is recessed in accordance with the outer contour of the piezo electric actuator.

5. The piezoelectric actuator according to claim 1, wherein
on the side of that the inner electrode (4) of the respective opposite polarity is contacted, the contour of the respectively non-contacted inner electrode (3) is embodied so that it is recessed a preset amount from the outer contour of the piezoelectric actuator (1).

6. The piezoelectric actuator according to claim 5, wherein
the contour of the respectively non-contacted inner electrode is recessed in accordance with the outer contour of the piezoelectric actuator.

* * * * *